US008860421B2

(12) United States Patent
Heo et al.

(10) Patent No.: US 8,860,421 B2
(45) Date of Patent: Oct. 14, 2014

(54) CELL VOLTAGE MEASURING APPARATUS AND METHOD OF BATTERY PACK HAVING MULTIPLEXERS TO OUTPUT VOLTAGE SIGNAL OF EACH CELL

(75) Inventors: Jin-Seok Heo, Daejeon (KR); Jee-Ho Kim, Daejeon (KR); Dal-Hoon Lee, Daejeon (KR); Sang-Hoon Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 405 days.

(21) Appl. No.: 13/050,493

(22) Filed: Mar. 17, 2011

(65) Prior Publication Data

US 2011/0210747 A1 Sep. 1, 2011

Related U.S. Application Data (63) Continuation of application No. PCT/KR2009/005344, filed on Sep. 18, 2009.

(30) Foreign Application Priority Data

Sep. 18, 2008 (KR) .......................... 10-2008-0091564
Sep. 18, 2009 (KR) .......................... 10-2009-0088767

(51) Int. Cl.
*G01N 27/416* (2006.01)
*G01R 31/36* (2006.01)
*G01R 19/165* (2006.01)
*H01M 10/48* (2006.01)

(52) U.S. Cl.
CPC ...... *G01R 31/3658* (2013.01); *G01R 19/16542* (2013.01); *H01M 10/48* (2013.01); *G01R 31/362* (2013.01)
USPC .......................................... 324/433; 324/434

(58) Field of Classification Search
CPC ................... G01R 31/3658; G01R 19/16542; G01R 31/362; H01M 10/48
USPC .................................................. 324/433, 434
See application file for complete search history.

(56) References Cited

U.S. PATENT DOCUMENTS 4,864,462 A * 9/1989 Madou et al. ................. 361/280
6,362,626 B2 3/2002 Furukawa (Continued)

FOREIGN PATENT DOCUMENTS

| JP | 9-312172 A | 12/1997 |
| JP | 11-248755 A | 9/1999 |
| JP | 2001-289886 A | 10/2001 |
| JP | 2003-70179 A | 3/2003 |
| JP | 2007-10316 A | 1/2007 |
| JP | 10-0686794 B1 | 2/2007 |

(Continued)

*Primary Examiner* — Yalkew Fantu
*Assistant Examiner* — Manuel Hernandez
(74) *Attorney, Agent, or Firm* — Birch, Stewart, Kolasch & Birch, LLP (57) ABSTRACT

A cell voltage measuring apparatus of a battery pack comprises a plurality of multiplexers connected corresponding to each cell group of the battery pack and operated to output a voltage signal of each cell in each cell group based on a reference potential applied from a corresponding cell group; a plurality of floating capacitors connected corresponding to each cell in each cell group and on which the voltage of each cell is charged and held; a switching means for enabling the voltage of each cell to be charged and held on each corresponding floating capacitor; and a controller for controlling the switching means per each cell group to enable the voltage of each cell to be charged and held on each corresponding floating capacitor and controlling each multiplexer to measure the cell voltage held on each floating capacitor of each cell group connected to each corresponding multiplexer.

20 Claims, 3 Drawing Sheets

(56) References Cited

U.S. PATENT DOCUMENTS

| | | | |
|---|---|---|---|
| 6,362,627 B1 | 3/2002 | Shimamoto et al. | |
| 7,863,904 B2 * | 1/2011 | Takeda et al. | 324/522 |
| 7,973,534 B2 * | 7/2011 | Tatebayashi et al. | 324/433 |
| 2006/0164042 A1 | 7/2006 | Sim | |
| 2007/0202371 A1 | 8/2007 | Takeda et al. | |

FOREIGN PATENT DOCUMENTS

| | | |
|---|---|---|
| JP | 2008-516197 A | 5/2008 |
| KR | 10-0814128 B1 | 3/2008 |
| KR | 10-2009-0015334 A | 2/2009 |
| KR | 10-0968348 B1 | 6/2010 |
| WO | 2006/041751 A2 | 4/2006 |

* cited by examiner

FIG. 1

Conventional Art

CELL VOLTAGE MEASURING APPARATUS AND METHOD OF BATTERY PACK HAVING MULTIPLEXERS TO OUTPUT VOLTAGE SIGNAL OF EACH CELL

CROSS-REFERENCE TO RELATED APPLICATION

This application is a continuation of International Application No. PCT/KR2009/005344 filed on Sep. 18, 2009, which claims priority to Korean Patent Application No. 10-2008-0091564 filed in Republic of Korea on Sep. 18, 2008, and Korean Patent Application No. 10-2009-0088767 filed in Republic of Korea on Sep. 18, 2009, the entire contents of which are incorporated herein by reference.

TECHNICAL FIELD

The present invention relates to a cell voltage measuring apparatus and method of a battery pack, and more particularly, to an apparatus and method for measuring the voltage of a plurality of cells in a battery pack per each cell group.

BACKGROUND ART

With recent concerns about the exhaust of fossil energy and environmental pollution, interests in electric vehicles or hybrid vehicles using electrical energy instead of fossil energy are increasing.

The electric vehicles or hybrid vehicles use a high capacity battery pack, and the battery pack includes a plurality of cells capable of repeatedly charging and discharging. During charging/discharging of the battery pack, it requires a proper maintenance of the state of charge (SOC) of each cell and protection of the battery pack from abnormal circumstances such as over-charging or over-discharging. Thus, it needs to periodically measure and monitor the voltage of each cell using a cell voltage measuring apparatus.

Figure 1:
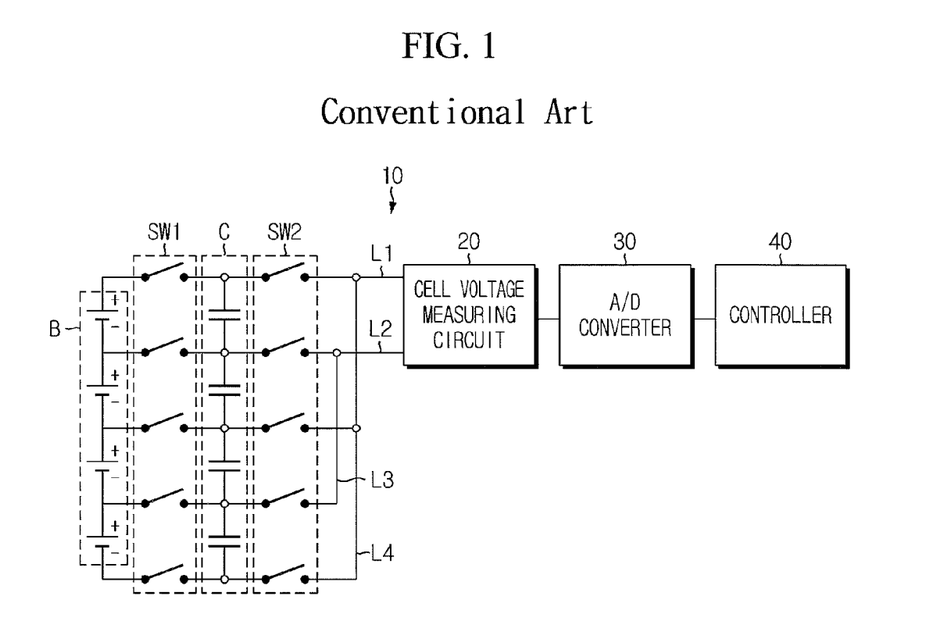
FIG. 1 is a circuit diagram of a conventional cell voltage measuring apparatus.

FIG. 1 is a circuit diagram of a conventional battery cell voltage measuring apparatus 10.

Referring to FIG. 1, the conventional battery cell voltage measuring apparatus 10 comprises a floating capacitor (C), a first switch (SW1), a second switch (SW2), a cell voltage measuring circuit 20, an A/D converter 30 and a controller 40.

The first switch (SW1) is turned on by the controller 40 so as to make a cell voltage measurement. Accordingly, the voltage of each cell (B) is charged on each corresponding floating capacitor (C). After charging of the cell voltage, all the first switch (SW1) is turned off, so that the cell voltage is held on the floating capacitor (C).

After charging and holding of the cell voltage, the second switch (SW2) is turned on in sequence according to a preset order. Accordingly, the voltage (cell voltage) held on each floating capacitor (C) is applied to the cell voltage measuring circuit 20 in sequence.

The cell voltage measuring circuit 20 measures the voltage held on each floating capacitor (C) and applied thereto in sequence, and outputs an analog voltage signal corresponding to each cell voltage to the A/D converter 30. Then, the A/D converter 30 converts the analog voltage signal into a digital voltage signal of a predetermined bit and outputs the digital voltage signal to the controller 40.

The controller 40 controls the overall operation of the first switch (SW1) and the second switch (SW2), and receives a digital voltage signal of each cell (B) outputted from the A/D converter 30 and stores the digital voltage signal in a memory (not shown). And, the controller 40 controls the charge/discharge of each cell (B) using voltage data of each cell (B) stored in the memory, and performs various battery protection operations including prevention of over-charging or over-discharging.

The cell voltage measuring circuit 20 includes a differential amplifier for outputting a voltage signal corresponding to the voltage between both terminals of the floating capacitor (C) to the A/D converter 30. However, the conventional cell voltage measuring circuit 20 has cell voltage measuring lines L1 to L4 to measure the voltage of a plurality of cells (four cells) using a single differential amplifier.

As mentioned above, the conventional cell voltage measuring apparatus 10 has cell voltage measuring lines L1 to L4 to measure the voltage of four cells using a single differential amplifier. Thus, a polarity of the voltage between both terminals of the floating capacitor (C) should be inverted so as to measure the voltage of even-numbered cells. For this purpose, the cell voltage measuring circuit 20 has a polarity inversion circuit therein, which results in a complicated circuit structure of the cell voltage measuring apparatus 10. And, the voltage of a plurality of cells is measured using a single differential amplifier. Thus, high potential is applied to the differential amplifier when voltages of upper side cells are measured. For this reason, it is needed to use a high durability device capable of standing the high potential as a differential amplifier. However, the high durability device is expensive, and thus, it causes an increases in manufacturing cost of the cell voltage measuring apparatus.

DISCLOSURE OF INVENTION

Technical Problem

The present invention is designed to solve the problems of the conventional art, and therefore it is an aspect of the present invention to provide an apparatus and method for measuring the voltage of a plurality of cells connected in series per each cell group without using a differential amplifier and a polarity inversion circuit, and a battery pack operating apparatus and a battery pack comprising said apparatus.

Solution to Problem

The present invention may provide a cell voltage measuring apparatus of a battery pack comprising a plurality of multiplexers connected corresponding to each cell group of the battery pack and operated to output a voltage signal of each cell included in each cell group based on a reference potential applied from a corresponding cell group; a plurality of floating capacitors connected corresponding to each cell included in each cell group and on which the voltage of each cell is charged and held; a switching means for enabling the voltage of each cell to be charged and held on each corresponding floating capacitor; and a controller for controlling the switching means per each cell group to enable the voltage of each cell to be charged and held on each corresponding floating capacitor and controlling each multiplexer to measure the cell voltage held on each floating capacitor of each cell group connected to each corresponding multiplexer.

Preferably, each of the multiplexers may have a reference potential input terminal to which a reference potential is applied from a corresponding cell group.

Preferably, the multiplexers output a voltage difference between both terminals of each floating capacitor as a voltage signal of each corresponding cell based on the reference potential.

Preferably, each of the multiplexers comprises a buffer for outputting the cell voltage held on each floating capacitor. In the present invention, the buffer may be configured as an operational amplifier.

Preferably, the apparatus according to the present invention may further comprise an A/D converter for converting a cell voltage signal outputted through each multiplexer into a digital voltage signal, and the A/D converter receives a cell voltage signal outputted from each multiplexer, converts the cell voltage signal into a digital voltage signal, and outputs the digital voltage signal to the controller.

In the present invention, the switching means may comprise a first switch for establishing or releasing a connection between a low potential terminal of each floating capacitor and an anode terminal of each corresponding cell; and a second switch for establishing or releasing a connection between a high potential terminal of each floating capacitor and a cathode terminal of each corresponding cell and a connection between an end of the first switch and a cell voltage measuring line.

According to the present invention, the controller turns on a first switch per each cell group, and in this state, turns on a second switch simultaneously or subsequently so that the voltage of each cell is charged on each corresponding floating capacitor. And, the controller then turns off a first switch and a second switch so that the voltage of each cell is held on each corresponding floating capacitor.

In the present invention, the controller enables cell voltage charging and holding of each cell group simultaneously or subsequently.

Preferably, the reference potential may be a lowest potential of a corresponding cell group.

According to another aspect of the present invention, the present invention may also provide a battery management system, a battery pack operating apparatus and a battery pack comprising the cell voltage measuring apparatus of a battery pack described above.

According to another aspect of the present invention, the present invention may also provide a cell voltage measuring method of a battery pack comprising (a) charging and holding the voltage of each cell included in each cell group of the battery pack on each corresponding floating capacitor; (b) subsequently selecting a plurality of multiplexers, each multiplexer being connected to each corresponding cell group; and (c) measuring the cell voltage held on each floating capacitor of a cell group connected to the selected multiplexer based on a reference potential applied from the corresponding cell group.

BRIEF DESCRIPTION OF THE DRAWINGS

The accompanying drawings illustrate the preferred embodiments of the present invention and are included to provide a further understanding of the spirit of the present invention together with the detailed description of the invention, and accordingly, the present invention should not be limitedly interpreted to the matters shown in the drawings.

MODE FOR THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 2:
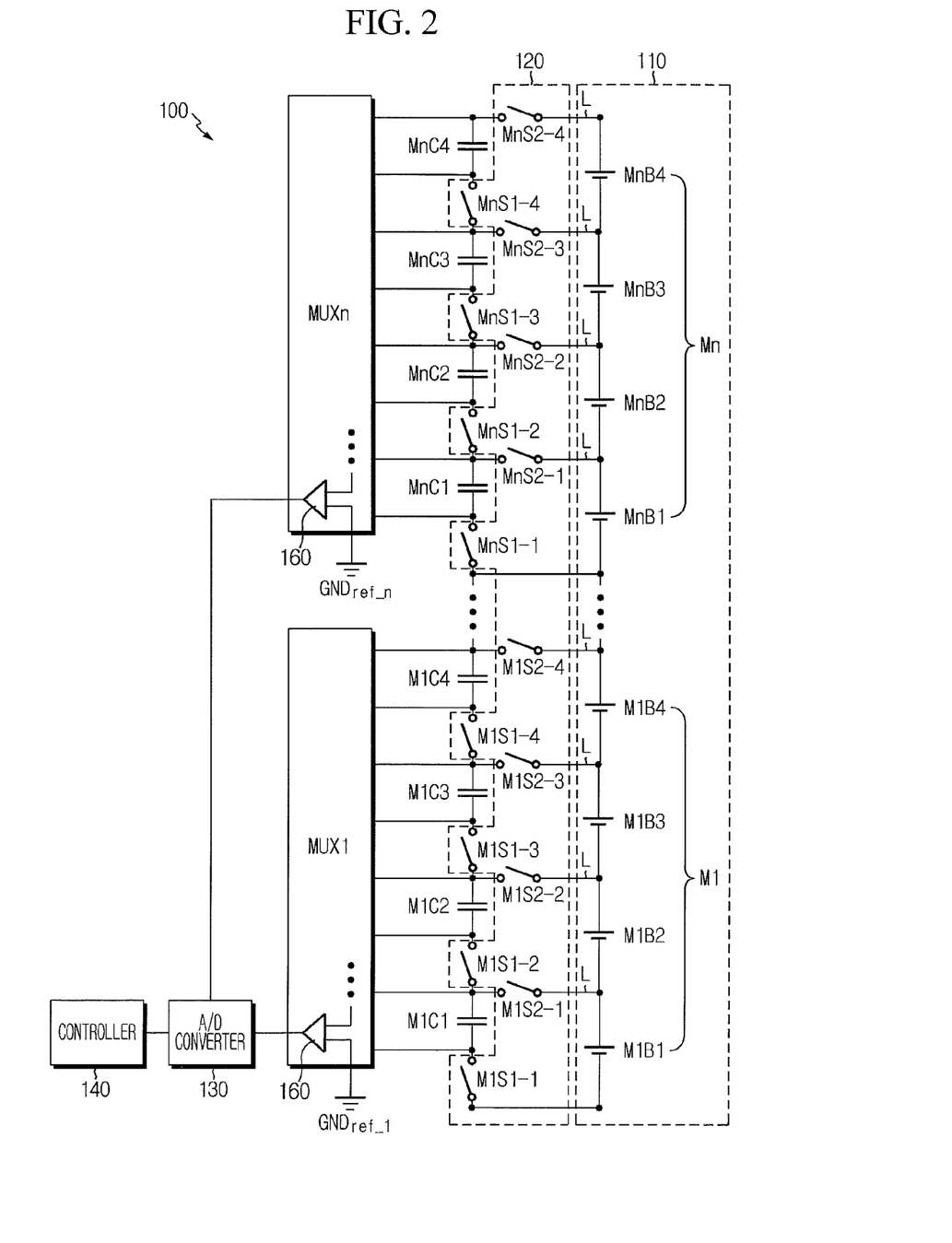
FIG. 2 is a circuit diagram of a cell voltage measuring apparatus of a battery pack according to the preferred embodiment of the present invention.

FIG. 2 is a circuit diagram of a cell voltage measuring apparatus of a battery pack according to the preferred embodiment of the present invention.

Referring to FIG. 2, the cell voltage measuring apparatus 100 of a battery pack according to the present invention comprises a battery pack 110, a plurality of multiplexers (MUX1, . . . , MUXn), a plurality of floating capacitors (M1B1 to M1B4, . . . , MnB1 to MnB4), a switching means 120 (M1S1-1 to M1S1-4, M1S2-1 to M1S2-4, . . . , MnS1-1 to MnS1-4, and MnS2-1 to MnS2-4), and a controller 140. The battery pack 110 has a plurality of cells (M1B1 to M1B4, . . . , MnB1 to MnB4) connected in series. The cells (M1B1 to M1B4, . . . , MnB1 to MnB4) comprise a first cell group (M1B1 to M1B4, collectively referred to as M1) to an $n^{th}$ cell group (MnB1 to MnB4, collectively referred to as Mn). Each cell group (M1, . . . , Mn) has a predetermined number of cells, for example four cells. The multiplexer (MUX1, . . . , MUXn) is installed corresponding to each cell group (M1, . . . , Mn). The floating capacitor (M1C1 to M1C4, . . . , MnC1 to MnC4) is installed corresponding to each of a plurality of cells (M1B1 to M1B4, . . . , MnB1 to MnB4) in each cell group (M1, . . . , Mn). The voltage of each cell (M1B1 to M1B4, . . . , MnB1 to MnB4) is charged and held on each corresponding floating capacitor (M1C1 to M1C4, . . . , MnC1 to MnC4). The switching means 120 is selectively turned on/off so that the cell voltage is charged and held on the floating capacitor (M1C1 to M1C4, . . . , MnC1 to MnC4). The controller 140 controls the switching means 120 per each cell group (M1, . . . , Mn) to enable the voltage of each cell (M1B1 to M1B4, . . . , MnB1 to MnB4) be charged and held on each corresponding floating capacitor (M1B1 to M1B4, . . . , MnB1 to MnB4), selects the multiplexers (MUX1, . . . , MUXn) in a predetermined order, and controls the selected multiplexer (MUX1, . . . , MUXn) to measure the cell voltage held on each floating capacitor (M1C1 to M1C4, . . . , MnC1 to MnC4) of a cell group (M1, . . . , Mn) connected to the selected multiplexer (MUX1, . . . , MUXn).

Optionally, an A/D converter 130 may be installed between the controller 140 and the multiplexer (MUX1, . . . , MUXn) to convert a cell voltage signal into a digital voltage signal, wherein the cell voltage signal is held on each floating capacitor (M1C1 to M1C4, . . . , MnC1 to MnC4) of a corresponding cell group (M1, . . . , Mn) and outputted from each multiplexer (MUX1, . . . , MUXn). In this case, the cell voltage held on each floating capacitor (M1C1 to M1C4, . . . , MnC1 to MnC4) is applied to the controller 140 through the A/D converter 130 in sequence.

The switching means 120 includes a first switch (M1S1-1 to M1S1-4, . . . , MnS1-1 to MnS1-4) and a second switch (M1S2-1 to M1S2-4, . . . , MnS2-1 to MnS2-4). The first switch (M1S1-1 to M1S1-4, . . . , MnS1-1 to MnS1-4) establishes or releases a connection between a low potential terminal of each floating capacitor (M1C1 to M1C4, . . . , MnC1 to MnC4) and an anode terminal of each corresponding cell.

The second switch (M1S2-1 to M1S2-4, . . . , MnS2-1 to MnS2-4) establishes or releases a connection between a high potential terminal of each floating capacitor (M1C1 to M1C4, . . . , MnC1 to MnC4) and a cathode terminal of each corresponding cell and a connection between an end of the first switch (M1S1-1 to M1S1-4, . . . , MnS1-1 to MnS1-4) and a cell voltage measuring line (L).

The cell voltage measurement by the cell voltage measuring apparatus 100 of a battery pack according to the present invention is representatively described based on each cell (M1B1 to M1B4) in the first cell group (M1).

First, the controller 140 turns on the first switch (M1S1-1 to M1S1-4) of the first cell group (M1) to connect a low potential terminal of each floating capacitor (M1C1 to M1C4) with an anode terminal of each corresponding cell (M1B1 to M1B4). While the first switch (M1S1-1 to M1S1-4) is turned on, the controller 140 turns on the second switch (M1S2-1 to M1S2-4) to connect a high potential terminal of each floating capacitor (M1C1 to M1C4) with a cathode terminal of each corresponding cell (M1B1 to M1B4). At this time, the second switch (M1S2-1 to M1S2-4) may be turned on simultaneously or subsequently. Then, an anode terminal and a cathode terminal of each cell (M1B1 to M1B4) are electrically connected to a low potential terminal and a high potential terminal of each corresponding floating capacitor (M1C1 to M1C4), respectively, so that the potential of each cell (M1B1 to M1B4) is applied to each corresponding floating capacitor (M1C1 to M1C4). For example, assuming the voltage of each cell is 4V, an electric potential of 0V is applied to a low potential terminal of the floating capacitor (M1C1) corresponding to the first cell (M1B1) and an electric potential of 4V is applied to a high potential terminal of the floating capacitor (M1C1), and thus a charging voltage of 4V is charged on the floating capacitor (M1C1). An electric potential of 4V is applied to a low potential terminal of the floating capacitor (M1C2) corresponding to the second cell (M1B2) and an electric potential of 8V is applied to a high potential terminal of the floating capacitor (M1C2), and thus a charging voltage of 4V is charged on the floating capacitor (M1C2). An electric potential of 8V is applied to a low potential terminal of the floating capacitor (M1C3) corresponding to the third cell (M1B3) and an electric potential of 12V is applied to a high potential terminal of the floating capacitor (M1C3), and thus a charging voltage of 4V is charged on the floating capacitor (M1C3). An electric potential of 12V is applied to a low potential terminal of the floating capacitor (M1C4) corresponding to the fourth cell (M1B4) and an electric potential of 16V is applied to a high potential terminal of the floating capacitor (M1C4), and thus a charging voltage of 4V is charged on the floating capacitor (M1C4).

Next, while the cell voltage is charged on the floating capacitor (M1C1 to M1C4) of the first cell group (M1), the controller 140 turns off all of the first switch (M1S1-1 to M1S1-4) and the second switch (M1S2-1 to M1S2-4) to release the connection between a cathode terminal and an anode terminal of each cell (M1B1 to M1B4) and a low potential terminal and a high potential terminal of each corresponding floating capacitor (M1C1 to M1C4). Then, each floating capacitor (M1C1 to M1C4) is isolated from each corresponding cell (M1B1 to M1B4) and adjacent floating capacitors, so that the cell voltage is held on the floating capacitor (M1C1 to M1C4).

The cell voltage charging and holding on the floating capacitor (M1C1 to M1C4, . . . , MnC1 to MnC4) may be performed simultaneously throughout the entire cell group or may be performed subsequently per cell group.

When the voltage of each cell (M1B1 to M1B4, . . . , MnB1 to MnB4) is charged and held on each corresponding floating capacitor (M1C1 to M1C4, . . . , MnC1 to MnC4) as mentioned above, the controller 140 selects the multiplexers (MUX1, . . . , MUXn) in a predetermined order.

Next, the controller 140 controls the selected multiplexer (MUX1, . . . , MUXn) to measure the cell voltage held on each floating capacitor (M1C1 to M1C4, . . . , MnC1 to MnC4) of a corresponding cell group (M1, . . . , Mn). For this purpose, the multiplexer (MUX1, . . . , MUXn) has a buffer 160 for outputting the cell voltage held on the floating capacitor (M1C1 to M1C4, . . . , MnC1 to MnC4).

A reference potential is applied from a corresponding cell group to the buffer. The buffer measures and outputs the cell voltage held between a low potential terminal and a high potential terminal of the floating capacitor (M1C1 to M1C4, . . . , MnC1 to MnC4) based on the reference potential. Preferably, the reference potential may be a lowest potential of a corresponding cell group. However, the present invention is not limited in this regard. Specifically, the buffer connects a low potential terminal of each floating capacitor (M1C1 to M1C4, . . . , MnC1 to MnC4) with the reference potential ($GND_{ref\_1}$ to $GND_{ref\_n}$), measures a voltage difference between both terminals of each floating capacitor (M1C1 to M1C4, . . . , MnC1 to MnC4) based on the reference voltage ($GND_{ref\_1}$ to $GND_{ref\_n}$), and outputs a cell voltage signal. Here, the reference potential ($GND_{ref\_1}$ to $GND_{ref\_n}$) is set in a reference potential input terminal of the multiplexer. Among potentials of cells in a corresponding cell group (M1, . . . , Mn), any one potential, preferably a lowest potential, or voltage on an anode terminal of a cell having a lowest potential is applied to the reference potential input terminal. The buffer 160 may be configured as a typical operational amplifier, not as a differential amplifier, and is capable of directly measuring the cell voltage of each floating capacitor (M1C1 to M1C4, . . . , MnC1 to MnC4). For example, a buffer included in the lowest multiplexer (MUX1) measures a charging voltage corresponding to the quantity of electric charge in each floating capacitor (M1C1 to M1C4) simultaneously or subsequently based on the reference potential ($GND_{ref\_1}$), and outputs a voltage signal of each corresponding cell (M1B1 to M1B4, . . . , MnB1 to MnB4). This cell voltage measuring method is equally applied to the upper multiplexer (MUX2 to MUXn) except that the reference potential is changed to $GND_{ref\_2}$ to $GND_{ref\_n}$.

The A/D converter 130 converts an analog voltage signal of each cell (M1B1 to M1B4, . . . , MnB1 to MnB4) outputted from the multiplexer (MUX1, . . . , MUXn) into a digital voltage signal of a predetermined bit, and outputs the digital voltage signal to the controller 140.

Accordingly, the controller 140 stores the digital voltage signal of each cell (M1B1 to M1B4, . . . , MnB1 to MnB4) outputted from the A/D converter 130 in a memory (not shown). In this way, cell voltage measurement of each cell (M1B1 to M1B4, . . . , MnB1 to MnB4) is completed. The controller 140 can control charging/discharging of each cell, or perform various battery protection such as prevention of over-charging or over-discharging using the digital voltage signal of each cell (M1B1 to M1B4, . . . , MnB1 to MnB4).

The controller 140 performing the above-mentioned operations may be implemented as a microprocessor capable of executing a source code into which the cell voltage measuring method of a battery pack according to the present invention is programmed, or a semiconductor chip in which a control scheme of the cell voltage measuring method of a battery pack according to the present invention is incorporated as a logic circuit. However, the present invention is not limited in this regard.

Meanwhile, the cell voltage measuring apparatus of a battery pack according to the present invention may be used in a battery pack operating apparatus provided with a power source from a battery pack.

For example, the cell voltage measuring apparatus may be included in various kinds of electronic appliances provided with the operating power from batteries, such as notebook computers, mobile phones, personal multimedia generators and so on.

In addition, the cell voltage measuring apparatus may be used in various kinds of power systems having batteries, such as fossil fuel vehicles, electric vehicles, hybrid vehicles, electric bikes, and so on.

Furthermore, the cell voltage measuring apparatus according to the present invention may be included in a battery management system (BMS) that controls charging/discharging of a battery pack and protects the battery pack from abnormal circumstances such as over-charging or over-discharging.

Moreover, it is obvious to an ordinary person skilled in the art that the cell voltage measuring apparatus according to the present invention may be modularized into a PCB circuit or an application specific integrated circuit (ASIC) and mounted in a battery pack.

Figure 3:
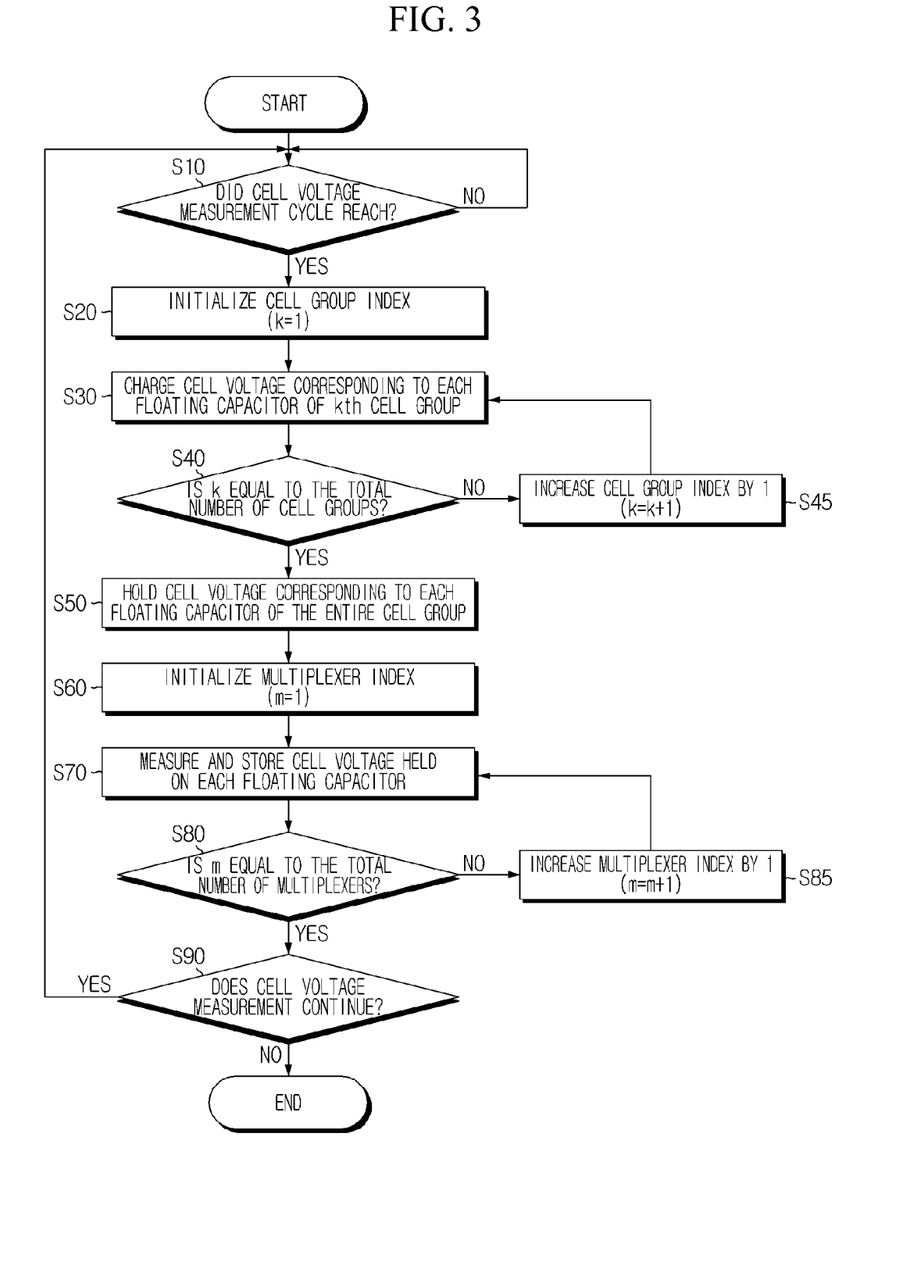
FIG. 3 is a flowchart of a cell voltage measuring method of a battery pack according to the preferred embodiment of the present invention.

FIG. 3 is a flowchart of a cell voltage measuring method of a battery pack according to the preferred embodiment of the present invention.

Hereinafter, a cell voltage measuring method of a battery pack according to the preferred embodiment of the present invention is described in detail with reference to FIG. 3.

First, in the step S10, the controller 140 determines whether a cell voltage measurement cycle reached or not. Here, the cell voltage measurement cycle may be arbitrarily set.

If the voltage measurement cycle reached, in the step S20, the controller 140 gives a cell group index k to each cell group (M1, . . . , Mn) in order to charge the cell voltage on each corresponding floating capacitor (M1C1 to M1C4, . . . , MnC1 to MnC4) per each cell group (M1, . . . , Mn). The controller 140 initializes the cell group index k to 1.

In the step S30, the controller 140 turns on the first switch (MkS1-1 to MkS1-4) of a $k^{th}$ cell group, and in this state, turns on the second switch (MkS2-1 to MkS2-4) at the same time or in a predetermined order so that the voltage of each cell (MkB1 to MkB4) is charged on each corresponding floating capacitor (MkC1 to MkC4). At present, the cell group index k is initialized to 1, and thus, in the step S30, the voltage of each cell (M1B1 to M1B4) in the first cell group (M1) is charged on each corresponding floating capacitor (M1C1 to M1C4).

In the step S40, the controller 140 determines whether or not the cell group index k is equal to the total number of cell groups (M1, . . . , Mn).

If the cell group index k is not equal to the total number of cell groups (M1, . . . , Mn), in the step S45, the controller 140 increases the cell group index k by 1, and directs the process to the step S30. Next, the steps S30, S40 and S45 are repeated until the cell group index k is equal to the total number of cell groups (M1, . . . , Mn), so that each cell voltage of the entire cell group (M1, . . . , Mn) is charged on each corresponding floating capacitor (M1C1 to M1C4, . . . , MnC1 to MnC4). That is, assuming the total number of cell groups is n, the controller 140 repeatedly performs the steps S30, S40 and S45 so that the voltage of each cell is charged on each corresponding floating capacitor from a second cell group to an $n^{th}$ cell group.

Although the above-mentioned embodiment shows the cell voltage is charged on the floating capacitor per each cell group (M1, . . . , Mn) in sequence, it is obvious to an ordinary person skilled in the art that cell voltage charging can be simultaneously made throughout all cell groups (M1, . . . , Mn).

When the cell group index k is equal to the total number of cell groups (M1, . . . , Mn), in the step S50, the controller 140 turns off all the first switch (M1S1-1 to M1S1-4, . . . , MnS1-1 to MnS1-4) and the second switch (M1S2-1 to M1S2-4, . . . , MnS2-1 to MnS2-4) so that each cell voltage is held on each floating capacitor (M1C1 to M1C4, . . . , MnC1 to MnC4).

Next, in the step S60, the controller 140 gives a multiplexer index m to each multiplexer (MUX1, . . . , MUXn) so as to measure the cell voltage through each multiplexer (MUX1, . . . , MUXn) in sequence, wherein each cell voltage is held on each corresponding floating capacitor (M1C1 to M1C4, . . . , MnC1 to MnC4). The controller 140 initializes the multiplexer index m to 1.

In the step S70, the controller 140 controls an $m^{th}$ multiplexer to measure the cell voltage held on each floating capacitor connected to the $m^{th}$ multiplexer (MUXm). Then, the $m^{th}$ multiplexer outputs an analog voltage signal corresponding to each cell voltage to an A/D converter 130. Then, the A/D converter 130 converts the analog voltage signal outputted from the $m^{th}$ multiplexer in sequence into a digital voltage signal of a predetermined bit, and outputs the digital voltage signal to the controller 140. The controller stores the digital voltage signal in a memory subsequently. At present, the multiplexer index m is initialized to 1, and thus, in this step (S70), each cell voltage held on each floating capacitor (M1C1 to M1C4) is measured and stored through the first multiplexer (MUX1). For this purpose, a buffer included in the first multiplexer (MUX1) measures a charging voltage corresponding to the quantity of electric charge in each floating capacitor (M1C1 to M1C4) simultaneously or subsequently based on the reference potential ($GND_{ref\_1}$), and outputs an analog voltage signal corresponding to the voltage of each cell (M1B1 to M1B4) to the A/D converter 130. This cell voltage measuring method is equally applied to the upper multiplexer (MUX2 to MUXn) except that the reference potential is changed to $GND_{ref\_2}$ to $GND_{ref\_n}$. In the step S80, the controller 140 determines whether or not the multiplexer index m is equal to the total number of multiplexers (MUX1, . . . , MUXn).

If the multiplexer index m is not equal to the total number of multiplexers (MUX1, . . . , MUXn), in the step S85, the controller 140 increases the multiplexer index m by 1 and directs the process to the step S70. Next, the controller 140 repeats the steps S70, S80 and S85 until the multiplexer index m is equal to the total number of multiplexers (MUX1, . . . , MUXn), so that all the cell voltage is measured and stored in the memory. That is, assuming the total number of multiplexers is n, the controller 140 selects a second multiplexer to an $n^{th}$ multiplexer in sequence, measures the cell voltage charged on each floating capacitor in the selected multiplexer and stores the cell voltage in the memory while repeating the steps S70, S80 and S85. Although the above-mentioned embodiment shows, in the steps S60 to S85, the controller 140 measures the cell voltage in sequence per each multiplexer (MUX1, . . . , MUXn), it is obvious to an ordinary person skilled in the art that the controller 140 may control the entire multiplexer (MUX1, . . . , MUXn) at the same time to simultaneously measure the same-numbered cell voltage in each multiplexer (MUX1, ..., MUXn). In the step S90, the controller 140 determines whether to continue the cell voltage measurement of the battery pack. If the battery pack is in use, it is possible to continue the cell voltage measurement. To continue the cell voltage measurement, the controller 140 directs the process to the step S10 and performs a cell voltage measurement of a next measurement cycle. On the contrary, to stop the cell voltage measurement, the controller 140 terminates the process.

Although not shown in the drawings, it is obvious to an ordinary person skilled in the art that the controller 140 may control charging/discharging of each cell with reference to a voltage value of each cell stored in the memory or may perform various battery protection operations including prevention of over-charging or over-discharging.

Hereinabove, the present invention is described in detail with reference to the specific examples and the accompanying drawings. However, the description proposed herein is just a preferable example for the purpose of illustrations only, not intended to limit the scope of the invention, so it should be understood that other equivalents and modifications could be made thereto without departing from the spirit and scope of the invention.

INDUSTRIAL APPLICABILITY

The cell voltage measuring apparatus of a battery pack according to the present invention can directly measure the voltage of each of a plurality of cells in the battery pack without using a differential amplifier and a polarity inversion circuit, resulting in a simple circuit configuration of the apparatus. And, the present invention measures the voltage of a plurality of cells per each cell group, thereby improving the efficiency of cell voltage measurement.

What is claimed is:

1. A cell voltage measuring apparatus of a battery pack including a plurality of cell groups, each of the cell groups including a plurality of cells, the cell voltage measuring apparatus comprising:
   a plurality of multiplexers each connected to a corresponding cell group of the battery pack and operated to output a voltage signal of each cell included in the corresponding cell group;
   a plurality of floating capacitors each connected to a corresponding cell included in each cell group and on which a voltage of each cell is charged and held;
   a switching means for enabling the voltage of each cell to be charged and held on each of the corresponding floating capacitors; and
   a controller for controlling the switching means for each cell group to enable the voltage of each cell to be charged and held on each floating capacitor and controlling each multiplexer to measure the cell voltage held on each floating capacitor of each cell group,
   wherein each multiplexer receives a reference potential applied from the corresponding cell group and outputs a voltage difference between both terminals of each floating capacitor as the voltage signal of each corresponding cell based on the reference potential, and
   wherein the switching means includes:
   each of a plurality of first switches for establishing or releasing a connection between a low potential terminal of one of the floating capacitors and an anode terminal of the cell corresponding to the one of the floating capacitors, as well as a connection between the one of the floating capacitors and the floating capacitor corresponding to a previous cell; and
   each of a plurality of second switches for establishing or releasing a connection between a high potential terminal of the one of the floating capacitors and a cathode terminal of the cell corresponding to the one of the floating capacitors, as well as a connection between an anode terminal of a subsequent cell and an end of a first switch corresponding to the subsequent cell.

2. The cell voltage measuring apparatus of a battery pack according to claim 1, wherein each of the multiplexers has a reference potential input terminal to which the reference potential is applied from the corresponding cell group.

3. The cell voltage measuring apparatus of a battery pack according to claim 1, wherein each of the multiplexers comprises a buffer for outputting the cell voltage signal based on the cell voltage held on each floating capacitor.

4. The cell voltage measuring apparatus of a battery pack according to claim 3, wherein the buffer is configured as an operational amplifier.

5. The cell voltage measuring apparatus of a battery pack according to claim 1, further comprising:
   an A/D converter for converting the cell voltage signal outputted through each multiplexer into a digital voltage signal,
   wherein the A/D converter receives the cell voltage signal outputted from each multiplexer, converts the cell voltage signal into the digital voltage signal, and outputs the digital voltage signal to the controller.

6. The cell voltage measuring apparatus of a battery pack according to claim 1, wherein the controller turns on each of the first switches for the corresponding cell group, and turns on each of the second switches simultaneously or subsequently so that the voltage of the corresponding cell is charged on each floating capacitor.

7. The cell voltage measuring apparatus of a battery pack according to claim 6, wherein in such state that the voltage of each cell is charged on each of the corresponding floating capacitors for each cell group, the controller turns off each of the first switches and each of the second switches so that the voltage of each cell is held on each of the corresponding floating capacitors.

8. The cell voltage measuring apparatus of a battery pack according to claim 6, wherein the controller enables cell voltage charging and holding of each cell group simultaneously or subsequently.

9. The cell voltage measuring apparatus of a battery pack according to claim 1, wherein the reference potential is a lowest potential of the corresponding cell group.

10. A battery management system comprising the cell voltage measuring apparatus of the battery pack defined in claim 1, wherein the battery management system is coupled to the battery pack to measure a voltage of a cell included in the battery pack by means of the cell voltage measuring apparatus of the battery pack and performs a battery pack protecting operation based on the measured cell voltage.

11. A battery pack operating apparatus comprising the cell voltage measuring apparatus of the battery pack defined in claim 1, and the battery pack whose cell voltage is measured by the cell voltage measuring apparatus of the battery pack, wherein the battery pack operating apparatus is operated by the battery pack.

12. A battery pack comprising the cell voltage measuring apparatus of the battery pack defined in claim 1, and cells whose voltages are measured by the cell voltage measuring apparatus of the battery pack.

13. A cell voltage measuring method of a battery pack including a plurality of cell groups, each of the cell groups including a plurality of cells, the cell voltage measuring method comprising:
- (a) charging and holding a voltage of each cell included in the corresponding cell group of the battery pack on a corresponding floating capacitor;
- (b) subsequently selecting a multiplexer among a plurality of multiplexers, each of the multiplexers being connected to a corresponding cell group; and
- (c) measuring the cell voltage held on each of the floating capacitors in the corresponding cell group connected to the selected multiplexer, wherein, in the step (c), each multiplexer receives a reference potential applied from the corresponding cell group by use of a buffer and outputs a voltage difference between both terminals of the floating capacitor corresponding to each cell as a cell voltage signal based on the reference potential, and wherein the cell voltage signal is read using a switching means that includes each of a plurality of first switches for establishing or releasing a connection between a low potential terminal of one of the floating capacitors and an anode terminal of the cell corresponding to the one of the floating capacitors, as well as a connection between the one of the floating capacitors and the floating capacitor corresponding to a previous cell, and each of a plurality of second switches for establishing or releasing a connection between a high potential terminal of each floating capacitor and a cathode terminal of the cell corresponding to the one of the floating capacitors, as well as a connection between an anode terminal of a subsequent cell and an end of a first switch corresponding to the subsequent cell.

14. The cell voltage measuring method of a battery pack according to claim 13, wherein the step (a) includes:
establishing a connection between the low potential terminal and a high potential terminal of the one of the floating capacitors and anode and cathode terminals of the cell corresponding to the one of the floating capacitors, respectively, to charge the voltage of the cell corresponding to the one of the floating capacitors; and releasing the connection between the low potential terminal and the high potential terminal of the one of the floating capacitors and the anode terminal and the cathode terminal of each corresponding the cell corresponding to the one of the floating capacitors, to hold the voltage of each cell on the cell corresponding to the one of the floating capacitors.

15. The cell voltage measuring method of a battery pack according to claim 14, wherein the step (a) is performed simultaneously or subsequently on the plurality of cells included in each cell group.

16. The cell voltage measuring method of a battery pack according to claim 14, wherein the holding of the cell voltage is performed simultaneously or subsequently on the plurality of cells included in each cell group.

17. The cell voltage measuring method of a battery pack according to claim 13, wherein, in the step (c),
all of the multiplexers are simultaneously controlled so that the voltages of numbered cells are simultaneously measured through each of the multiplexers.

18. The cell voltage measuring method of a battery pack according to claim 13, wherein, in the step (c),
the multiplexers are subsequently selected, and
the voltages of the plurality of cells included in the corresponding cell group connected to the selected multiplexer are measured.

19. The cell voltage measuring method of a battery pack according to claim 13, wherein the step (c) includes:
receiving the cell voltage signal output from one of the multiplexers and converting the cell voltage signal into a digital voltage signal; and
receiving the digital voltage signal and storing the digital voltage signal in a memory.

20. The cell voltage measuring method of a battery pack according to claim 13, wherein the reference potential is a lowest potential of the corresponding cell group.

* * * * *